United States Patent [19]

Hofmann

[11] 4,211,917
[45] Jul. 8, 1980

[54] CIRCUIT BOARD TESTING APPARATUS AND METHOD

[75] Inventor: George F. Hofmann, Des Moines, Wash.

[73] Assignee: The Boeing Company, Seattle, Wash.

[21] Appl. No.: 925,302

[22] Filed: Jul. 17, 1978

[51] Int. Cl.² .................. G06F 11/00; G01R 15/12; G01R 31/02
[52] U.S. Cl. ............................. 371/20; 324/73 PC
[58] Field of Search ........ 235/302; 324/73 R, 73 AT, 324/73 PC, 158 F

[56] References Cited

U.S. PATENT DOCUMENTS

| | | | |
|---|---|---|---|
| 2,902,665 | 9/1959 | D'Amico | 339/184 |
| 3,117,461 | 4/1965 | Hagan et al. | 339/184 |
| 3,582,867 | 6/1971 | Thompson | 339/92 |
| 3,611,272 | 10/1971 | Fairbairn | 339/184 M |
| 3,723,867 | 3/1973 | Canarutto | 324/73 PC |
| 3,818,280 | 6/1974 | Smith et al. | 317/101 DH |
| 3,953,797 | 4/1976 | Berard et al. | 324/158 F |
| 4,017,793 | 4/1977 | Haines | 324/73 PC |
| 4,097,797 | 6/1978 | Finet | 235/302 X |
| 4,108,358 | 8/1978 | Niemaszyk et al. | 235/302 |
| 4,132,948 | 1/1979 | Katz | 324/158 F |

FOREIGN PATENT DOCUMENTS 1474721 2/1967 France.

OTHER PUBLICATIONS

Pettie "Connection Alignment Pin With Selectable Key" *IBM Tech. Disclosure Bulletin* vol. 15, No. 2 Jul. 1972, pp. 624–625.

Ingman "Card—Programmable Digital IC Tester Simplifies Incoming Inspection" *Hewlett-Packard Journal*, vol. 28, No. 2 pp. 11–18, Oct. 1976.

*Primary Examiner*—David H. Malzahn

[57] ABSTRACT

A system by which a plurality of different circuit boards can be reliably tested by a single testing apparatus having a plurality of test programs adapted for testing particular circuit boards. Each circuit board has a pair of non-circular keying pins, with each circuit board having its particular pair of pins arranged in a unique combination of angular positions. There is an inter-facing member connected between the circuit board to be tested and the testing apparatus. The inter-facing member has a pair of rotatably mounted indexing discs, each having a plurality of receptacles, and each receptacle having a particular angular orientation to receive a keying pin of a similar angular orientation. A particular circuit board can be mounted to the inter-facing unit by moving the two indexing discs to the appropriate location so that the appropriate receptacles of the two discs receive the two keying pins of that particular circuit board. When the indexing discs are in a position to receive a particular circuit board, this connects predetermined circuit elements to the test apparatus to provide an identifying signal to the test apparatus to indicate the particular circuit board which is connected to the inter-facing member. This signal insures that the test apparatus is arranged to utilize the proper test program for that particular circuit board.

17 Claims, 3 Drawing Figures

CIRCUIT BOARD TESTING APPARATUS AND METHOD

BACKGROUND OF THE INVENTION

1. Field of the Invention

The present invention relates to a testing system for units such as printed circuit boards, and more particularly to a system which enables a single test apparatus to reliably operate with a plurality of different circuit boards.

2. Description of the Prior Art

For some time computer controlled automatic test equipment has been used to detect faults in printed circuit boards. Generally there is a unique computer test program for each particular circuit board to be tested. It is important to ensure that the proper test program be selected for the particular circuit board, since the electrical stimuli applied by an incorrect test program may cause damage to the circuit board. One method of doing this is by properly labelling the circuit board and providing written instructions to the operator to select a particular program for a certain circuit board. However, this system is subject to human error. Thus, it becomes desirable to have a test system which automatically prevents the wrong test program from being applied to a particular circuit board.

One means of accomplishing this is by providing a hardware interlock system whereby it is not possible to connect a particular circuit board to the test apparatus unless a particular element or elements in the circuit board are able to mechanically interfit with other components associated with the test apparatus. This general sort of mechanical arrangement is known in the Prior Art. For example, U.S. Pat. No. 3,117,461, Hagan et al, discloses a keying device for plug-in circuit boards. There are provided a plurality of socket members mounted to one unit, with these socket members having a predetermined angular configuration. There is mounted to a second unit a plurality of mating keying pins having the same angular orientation as the two socket elements. Thus, the two units can be plugged together only when the sockets and pins have the same angular orientation. By providing various circuit boards with keying pins of different angular orientations, it is possible to have a number of different circuit boards with the same type of electrical connecting elements, but with different keying elements to prevent an incorrect connection of the circuit board.

Other examples of such keying arrangements are shown in the following patents:

U.S. Pat. No. 2,902,665, D'Aimco: U.S. Pat. No. 3,582,867, Thompson et al; U.S. Pat. No. 3,611,272, Fairbairn et al; U.S. Pat. No. 3,818,280, Smith et al; French Pat. No. 1,474,721.

Also, a technical disclosure bulletin published by International Business Machine, Volume 15, No. 21, July 1972 discloses an alignment pin having a particular fixed orientation to permit the joining together of certain units.

Mechanical interfacing devices such as those described above have been used in the field to prevent insertion of printed circuit boards into incorrect sockets in assemblies which contain a plurality of sockets, each of which is otherwise identical. These interfacing devices have also been proposed for applications such as connecting circuit boards to test equipment. Generally, this would involve the use of a unique interface adapter placed between the circuit board and the test equipment, and this adapter would contain a hard wired electrical circuit, thus enabling the test equipment to determine which adapter, and thus which circuit board, has been connected for the particular test program selected. However, the advancement in the state of the art in automatic test equipment has caused a situation wherein a single adapter may be used for many different circuit boards, each of which has a similar connector configuration. Accordingly, it is the object of the present invention to provide a test system able to reliably test a number of different circuit boards requiring different test programs, without requiring specialized apparatus for each particular type of circuit board being tested.

SUMMARY OF THE INVENTION

In the system of the present invention there is a testing apparatus and a plurality of units which are to be tested by apparatus. There is provided for the various units a plurality of keying means, each keying means being mounted to a related one of the units, and each keying means having a predetermined mating orientation unique to the unit to which that keying means is mounted. In the preferred form, the keying means for each unit comprises a pair of non-circular indexing pins having a combination of angular orientations unique to that particular unit.

There is a unit inter-facing member adapted and arranged to be connected to each of said units and to the testing apparatus. In the preferred form this inter-facing member is in the form of an adaptor to which the unit to be tested is plugged in, and which in turn is plugged into the testing apparatus.

A moveable mating means is mounted to the inter-facing member in a manner to be moveable to a plurality of mating locations, with each mating locating corresponding to a related one of the keying means. The mating means is so arranged that at any one of the mating locations the mating means is able to be matched to the corresponding keying means to engage that keying means in mating relationship. This permits the unit inter-facing member to be connected to that unit having the keying means for which the mating means is matched.

The inter-facing member is also provided with a plurality of identifying circuit means, each of which corresponds to a related one of the units and which is arranged to generate an identifying signal for the unit to which that circuit means corresponds.

Switch means is operatively positioned between the plurality of circuit means and the testing apparatus. Further, the switch means is operatively connected to the mating means in a manner that with movement of the mating means to any particular mating location, the switch means connects to the testing apparatus the circuit means which corresponds to the unit having the keying means corresponding to that particular mating location.

Thus, when a particular unit is connected to the inter-facing member to be tested by the testing apparatus, the mating means is necessarily moved to a mating location corresponding to the keying means of that particular unit. The result is that the circuit means corresponding to that particular unit transmits to the testing apparatus the signal identifying that particular unit, thus ensuring that the testing apparatus is able to employ the proper computer program and perform a testing procedure appropriate for that particular unit.

In the preferred form the mating means is mounted for rotation to various angular positions, each corresponding to a related angular orientation of a related keying member. The switching means comprises a rotatable switching member having a plurality of angularly spaced contact positions by which contact is made with a selected one of a plurality of circuit elements. In the preferred form, the circuit elements are provided quite simply in the form of resistors of various values.

In the method of the present invention, an apparatus is provided such as that indicated above. To test any particular unit, the mating means of the inter-facing member is moved to a location corresponding to the keying means of that particular unit being tested. The unit being tested is then connected to the inter-facing member which is in turn connected to the test apparatus. This connects the appropriate circuit means to the test apparatus to transmit an appropriate identifying signal to the test apparatus. Thus, the test apparatus is assured of applying to the unit to be tested the proper test program for that particular unit.

Other features of this invention will become apparent from the following detailed description.

DESCRIPTION OF THE PREFERRED EMBODIMENT

Figure 1:
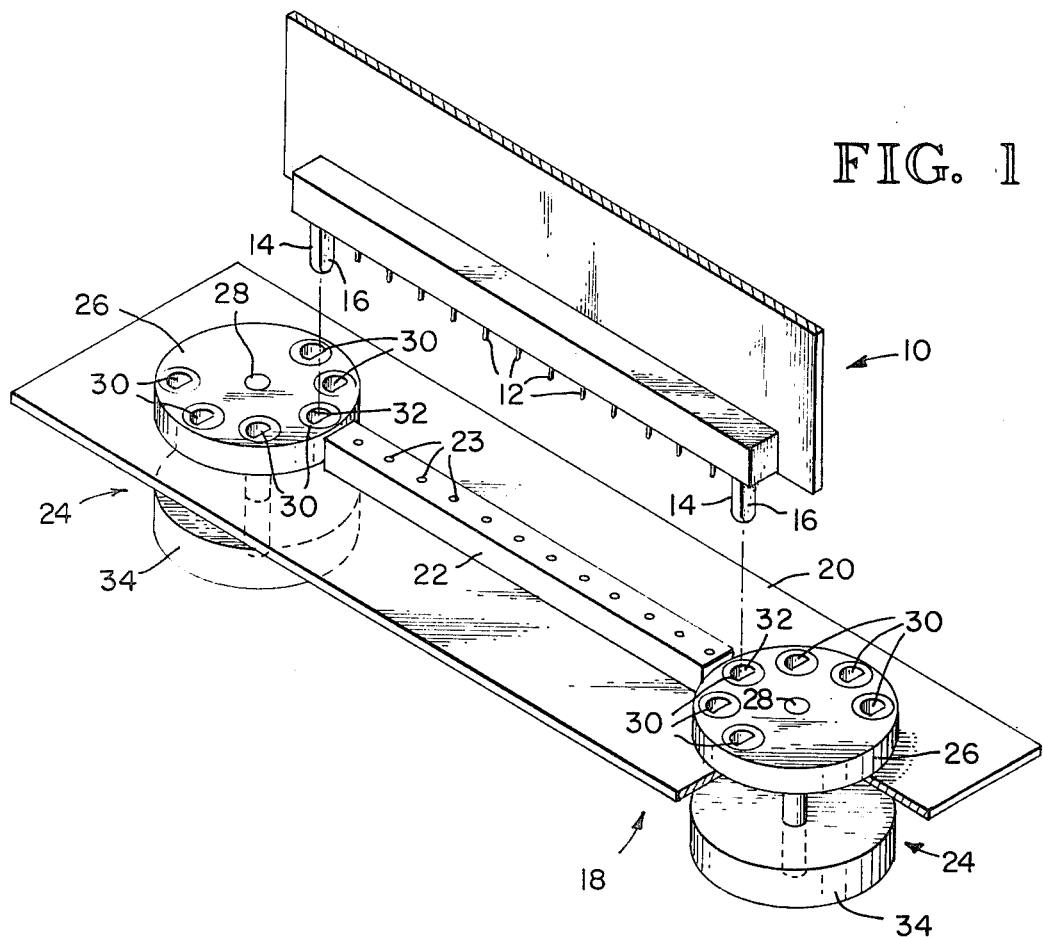
FIG. 1 is an isometric view showing somewhat semi-schematically an inter-facing member of the present invention in a position to engage in mating relationship a printed circuit board which is to be tested.

In FIG. 1, there is shown in somewhat simplified form a single circuit board 10 adapted to be tested by the system of the present invention. It is to be understood that while the present invention is described herein as applied to testing circuit boards specifically, the term "circuit board" is to be interpretated in a broader sense to include other units adapted to the testing procedures described herein. The circuit board 10 has a plurality of electrical components mounted thereon (not shown herein for ease of illustration), and along one edge of the circuit board there are provided a plurality of connecting plugs 12. For economy of manufacture, even though the circuit boards themselves may contain a variety of different circuit components in different arrangements, the connecting plugs 12 are quite often arranged in uniform configuration.

Thus, with a variety of circuit boards having a common arrangement of connecting plugs 12, there is the problem (as described earlier herein) of plugging a particular circuit board in the testing apparatus and possibly applying the wrong testing program thereto.

Accordingly, there is provided for each circuit board a pair of keying elements or pins 14. As shown herein, the two keying elements 14, are provided on opposite ends of and adjacent to the connecting plugs 12. Each keying element 14 has a noncircular configuration, which in the particular embodiment shown herein is accomplished by forming each keying element 14 as a cylindrical pin with one flattened side 16. Each different circuit board has its two keying elements 14 at a particular angular position unique to that particular circuit board 10. Thus, each circuit board 10 can in a sense be "identified" by the particular angular orientation of the flattened side 16 of the keying elements 14. It is to be understood that this means of "coding" or "identifying" circuit boards 10 by selecting the combination of angular orientations of the keying elements 14 is of itself known in the Prior Art.

Figure 2:
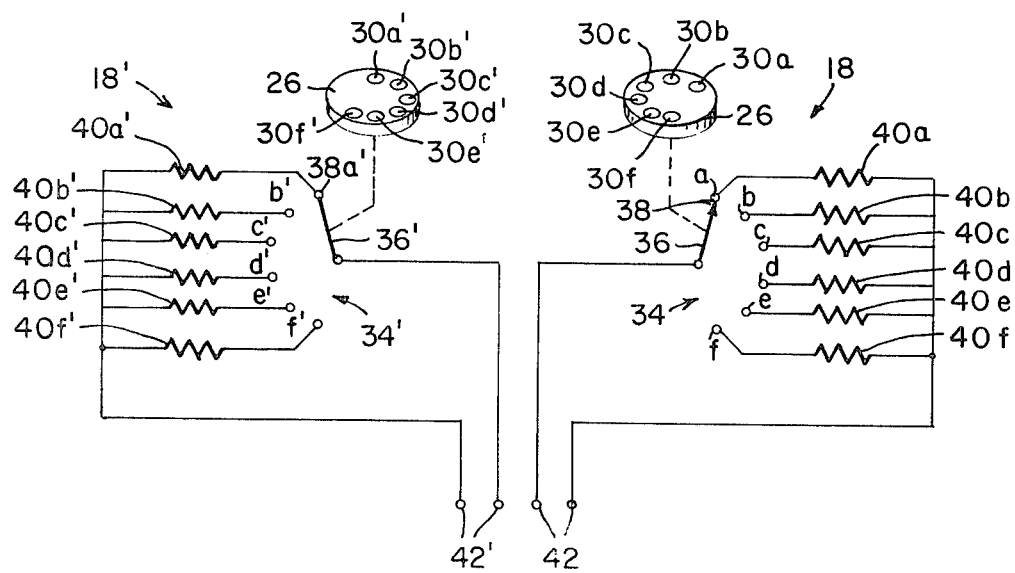
FIG. 2 is a schematic view showing the main operating components of the inter-facing member shown in FIG. 1.

Of particular significance in the present invention is the inter-facing member 18 shown somewhat schematically in both FIGS. 1 and 2. This inter-facing member 18 is arranged to interconnect a variety of circuit boards 10 with the testing apparatus of the present invention in a manner to ensure that the proper testing program is applied to any particular circuit board 10. The inter-facing member 18 comprises a housing, a portion of which is shown at 20, and has a socket member 22 arranged to receive the connecting plugs 12 of the board 10. While not shown herein for ease of illustration it is to be understood that the inter-facing member 18 in turn connects to the test apparatus to make electrical connection between the appropriate elements of the testing apparatus and the plugs 12 of the board 10.

On opposite sides of the socket member 22 are a pair of indexing members 24, arranged to mate with keying elements 14 of the board 10. Each indexing member 24 comprises a circular dial member 26 mounted for rotation about its center axis 28. At regularly spaced locations around the periphery of the dial member 26 are a plurality of indexing sockets 30 each having a cross sectional configuration substantially identical to that of the keying elements 14. Thus, each indexing socket 30 has a cylindrically curved sidewall with a single flattened portion.

Each dial member 26 may be rotated so that any one of the indexing sockets 30 can be moved to an indexing location, indicated at 32, which indexing location 32 is adjacent to and in alignment with the socket member 22. When an indexing socket 30 is at the indexing location 32, it is arranged to receive in mating engagement a related keying element 14 of a circuit board 10 which is being plugged into the inter-facing member 18. It will be noted that each of the indexing sockets 30 is arranged so that when any one socket 30 is at the indexing location 32, it has an angular orientation different from any one of the other sockets 30 at the indexing location 32. Thus, for a particular circuit board 10 having its keying elements 14 in a particular angular orientation, each of the two dial members 26 must be in a particular angular position so that the two keying elements 14 can fit into the two appropriate sockets 30 and permit engagement of the board 10 with inter-facing member 18.

Each dial member 26 is connected to a related switch, indicated schematically at 34. In the simplified form shown herein, each switch 34 comprises a contact arm 36 rotatably mounted with its dial member 26 so as to be moveable to any one of six contact locations 38. The contact locations 38 are so arranged that when any one of the indexing sockets 30 is at the indexing location 32 the contact arm 36 is making contact with a corresponding contact point 38. Each of the contact points 38 is connected to a related resistor 40 so that when the contact arm 38 is engaging a particular contact point 38, its related resistor 40 is connected between a pair of terminals 42.

For purposes of description the indexing sockets 30 of each dial member 26 have been designated sequentially 30a through 30f. Each corresponding set of contact points 38 having been given corresponding letter designations, a-f, and each set of six resistors have been designated accordingly 40a-40f. Those components on the right side of FIG. 2 are distinguished from those on the left side of FIG. 2 by giving those on the left side a prime (') designation.

To describe now the manner in which a particular circuit board 10 is connected to the inter-facing member 18, let it be assumed that the two keying elements 14 of a particular circuit board 10 have an angular orientation such that one element 14 will only fit into sockets 30d at the right hands indexing location, and that the other keying element 14 will fit only in the left hand socket 30c'. Thus, to plug the board 12 into the inter-facing member 18, the two dial members 26 and 26' must be rotated so that the indexing sockets 30d and 30c' are at the indexing locations 32. In these locations, the right indexing arm 36 would be engaging the contact 38 at location d, and the left switch arm 36' would be contacting the contact point 38 at location c'. Thus, the resistor 40d would be connected between the terminals 42 and the resistor 40c' would be connected between the terminals 42'.

The resistors 40a through 40f and 40a' through 40f' are selected at different values. Thus, by simply imparting a voltage across the terminals 42 and also across the terminals 42', it is possible to ascertain which of the resistors, 40a through 40f and 40a' through 40f', are in the two current paths, and thus determine the location of the two switch arms 36 and 36'. This in turn, of course, indicates the locations of the two dial members 30a and 30a', which in turn provides identification for the particular circuit board 10.

Figure 3:
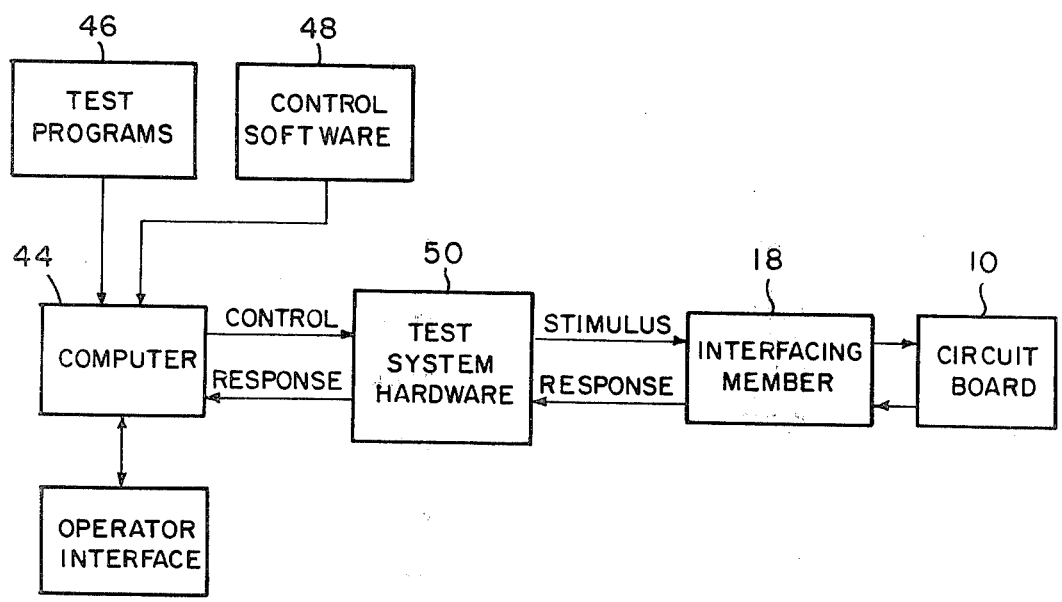
FIG. 3 is a block diagram showing the main components of the overall testing system of the present invention.

With the foregoing description of the operation of the inter-facing apparatus 18 in mind, attention will now be directed to FIG. 3 which illustrates the overall testing system of the present invention. There is a computer 44 which is supplied with a plurality of test programs 46, with each of the test programs 46 relating to a particular circuit board 10. The computer 44 is also provided with a control program 48 which applies a particular test program to the test program hardware 50. Typically the test system hardware 50 would be made up of components to provide various electrical stimuli (e.g. wave form generators, power supplies, etc.) and also measurement equipment (e.g. volt meters, ohmmeters, etc.).

The inter-facing member 18 is connected to the test system hardware 50, and any particular circuit board to be tested 10 is in turn connected to the inter-facing member 18. As described previously herein, the board 10 is connected to the inter-facing member 18 by first turning the indexing dials 26 to the appropriate locations to cause the indexing sockets 30 to match the particular orientation of the keying elements 14, after which the board 10 can be plugged into the inter-facing member 18.

The testing begins initially by the person performing the testing identifying in the computer 44 the particular circuit board 10 which is being tested. When the computer receives this identification, it transmits an interrogating signal through the two sets of terminals 42 and 42'. The response to the interrogating signal depends, of course, upon the location of the two switch arms 36 and 36'. If the circuit board 10 under test has been properly identified by the operator in the computer 44, then there will be a response signal from the inter-facing member 18 to indicate that the identification has been correct. However, in the event that the operator has improperly identified the circuit board 10 under test, then the interrogating signal transmitted to the terminals 42 and 42' will travel paths through resistors 40 which indicate that the locations of the two dials 26 do not correspond to the identification of the circuit board 10 as determined by the orientation of the two keying elements 14. Thus, the return signal from the inter-facing member 18 will indicate the improper identification, and the computer will automatically prevent the initiating of the testing procedure until the circuit board 10 has been properly identified in the computer 44.

What is claimed is:

1. A testing system comprising:
   a. a testing apparatus
   b. a plurality of units which are to be tested by said testing apparatus,
   c. a plurality of keying means, each keying means being mounted to a related one of said units, with each keying means having a predetermined mating orientation unique to the unit to which that keying means is mounted,
   d. a unit inter-facing member adapted and arranged to be connected to said testing apparatus and selectively connected to said units, said unit inter-facing member comprising:
      1. a movable mating means mounted to said unit inter-facing member in a manner to be moveable to a plurality of mating locations, each mating location corresponding to a related one of said keying means, such that at any one of said mating locations the mating means is able to be matched to the corresponding keying means to engage that keying means in mating relationship and permit the unit inter-facing member to be connected to that unit having the keying means for which the mating means is matched,
      2. a plurality of identifying circuit means provided by said inter-facing member, each of said circuit means corresponding to a related one of said units, and being arranged to generate an identifying signal for the unit to which that circuit means corresponds,
      3. switch means connected to the plurality of circuit means and said testing apparatus, in a manner that with movement of said mating means to any particular mating location, said switch means connects to the testing apparatus the circuit means which corresponds to the unit having the keying means corresponding to that particular mating location, whereby when a particular unit is connected to said inter-facing member to be tested by said testing apparatus, said mating means is necessarily moved to a mating location corresponding to the keying means of that particular unit, with the result that the circuit means corresponding to that particular unit transmits to the testing apparatus the signal identifying that particular unit, thus ensuring that the testing apparatus is able to perform a testing procedure appropriate to that particular unit.

2. The system as recited in claim 1, wherein each of said keying means comprises at least one non-circular keying element having a particular angular orientation, said mating means being mounted for rotation to various angular mating locations, each of which corresponds to a related one of the angular orientations of the keying elements.

3. The system as recited in claim 2, wherein said mating means comprises a rotatably mounted dial member having a plurality of mating elements spaced angularly on the dial member and moveable with said dial member to an indexing location for engagement with a related keying element.

4. The system as recited in claim 3, wherein said switching means comprises a rotatably mounted switching member having a plurality of angularly spaced contact locations for said circuit means, each of which corresponds to a related angular position of said dial member, in a manner that with a particular mating element at said indexing location, the switching member makes contact at the corresponding contact location.

5. The system as recited in claim 2, wherein said switching means comprises a rotatably mounted switching member having a plurality of angularly spaced contact locations for said circuit means, each contact location corresponding to a related angular location of the mating means, such that when the mating means is at a particular angular location, the switching member makes contact at the corresponding contact location.

6. The system as recited in claim 1, wherein:
   a. each of said keying means comprises at least one non-circular keying element having a particular angular orientation,
   b. said mating means comprises a rotatable dial member mounted to said inter-facing member for rotation to various angular mating locations, each of which corresponds to a related one of the angular orientations of the keying elements,
   c. said switch means comprises a switch member connected to said dial member so as to be rotatable therewith to various angularly spaced contact points for said circuit means, each contact point corresponding to a related mating location and angular orientation of a related keying element,
   d. each of said circuit means being connected to a related contact point corresponding to the particular keying element for which the dial member is positioned so as to place the switch member in engagement with the corresponding circuit means,
whereby when a particular unit is connected to the inter-facing member to be tested by the testing apparatus, the dial member is necessarily moved to a position such that the switch member is also rotated to a position to make contact with the circuit means corresponding to the unit being tested.

7. The system as recited in claim 1, wherein:
   a. each of said keying means comprises a pair of non-circular keying elements, with the keying elements of each pair having a particular combination of angular orientation,
   b. said mating means comprises a pair of rotatable dial members mounted to said inter-facing member for rotation to various angular mating locations, the locations of each dial member each corresponding to a related one of the angular orientations of the related keying element,
   c. said switch means comprising two switching means, each connected to a related dial member so as to be rotatable therewith to various angularly spaced contact points for said circuit means, each contact point corresponding to a related mating location and angular orientation of a related keying element,
   d. each of said circuit means comprising two sets of circuits, each circuit connected to and corresponding to a related contact point which in turn corresponds to the particular keying element for which the related dial element is positioned, so as to place the related switch member in engagement with the related corresponding circuit,
whereby when a particular unit is connected to the inter-facing member to be tested by the testing apparatus the two dial members are necessarily moved to position so that the two switch members are also rotated to positions to make contact with the two circuits corresponding to the unit being tested.

8. In a computerized testing system, comprising:
   a. a plurality of units which are to be tested,
   b. test system hardware to provide testing inputs to a unit being tested and receive test response from the unit being tested,
   c. a computer having a plurality of test programs for various units to be tested with said computer being programed to selectively apply various test programs to various units being tested,
an improvement to ensure that the computer is applying the proper program to the unit to be tested, said improvement comprising:
   a. a plurality of keying means, each keying means being mounted to a related one of said units, with each keying means having a predetermined mating orientation unique to the unit to which that keying means is mounted,
   b. a unit inter-facing member adapted and arranged to be connected to said test system hardware and selectively connected to said units, said unit inter-facing member comprising:
      1. a moveable mating means mounted to said unit inter-facing member in a manner to be moveable to a plurality of mating locations, each mating location corresponding to a related one of said keying means, such that at any one of said mating locations the mating means is able to be matched to the corresponding keying means to engage that keying means in mating relationship and permit the unit inter-facing member to be connected to that unit having the keying means for which the mating means is matched,
      2. a plurality of identifying circuit means provided by said inter-facing member, each of said circuit means corresponding to a related one of said units, and being arranged to generate an identifying signal for the unit to which that circuit means corresponds,
      3. switch means connected to the plurality of circuit means and said test system hardware, in a manner that with movement of said mating means to any particular mating location, said switch means connects to the test system hardware the circuit means which corresponds to the unit having the keying means corresponding to that particular mating location,
whereby when a particular unit is connected to said interfacing member to be tested, said mating means is necessarily moved to a mating location corresponding to the keying means of that particular unit, with the result that the circuit means corresponding to that particular unit transmits to the computer the signal identifying the particular unit, thus ensuring that the test system hardware is able to perform a testing procedure appropriate to that particular unit.

9. In the computerized system of claim 8, wherein each of said keying means comprises at least one non-circular keying element having a particular angular orientation, said mating means being mounted to various angular mating locations, each of which corresponds to a related one of the angular orientations of the keying elements.

10. In the computerized system of claim 9, wherein said mating means comprises a rotatably mounte dial member having a plurality of mating elements spaced angularly on the dial member and moveable with said dial member to an indexing location for engagement with a related keying element.

11. In the computerized system of claim 10, wherein said switch means comprises a rotatably mounted switching member having a plurality of angularly spaced contact locations for said circuit means, each of which corresponds to a related angular position of said dial member, in a manner that with a particular mating element at a said indexing location, the switching member makes contact at the corresponding contact location.

12. In the computerized system of claim 11, wherein said switch means comprises a rotatably mounted switching member having a plurality of angularly spaced contact locations, for said circuit means, each contact location corresponding to a related angular location of the mating means, such that when the mating means is at a particular angular location, the switching member makes contact at a related contact location.

13. In the computerized system of claim 8, wherein
   a. each of said keying means comprises at least one non-circular keying element having a particular angular orientation,
   b. said mating means comprises a rotatable dial member mounted to said inter-facing member for rotation to various angular mating locations, each of which corresponds to a related one of the angular orientations of the keying elements,
   c. said switch means comprises a switch member connected to said dial member so as to be rotatable therewith to various angularly spaced contact points for said circuit means, each contact point corresponding to a related mating location and angular orientation of a related keying element,
   d. each of said circuit means being connected to a related contact point corresponding to the particular keying element for which the dial member is positioned so as to place the switch member in engagement with the corresponding circuit means,
whereby when a particular unit is connected to the inter-facing member to be tested by the testing apparatus, the dial member is necessarily moved to a position such that the switch member is also rotated to a position to make contact with the circuit means corresponding to the unit being tested.

14. In the computerized system of claim 8, wherein:
   a. each of said keying means comprises a pair of non-circular keying elements, with the keying elements of each pair having a particular combination of angular orientation,
   b. said mating means comprises a pair of rotatable dial members mounted to said inter-facing member for rotation to various angular mating locations, the locations of each dial member each corresponding to a related one of the angular orientations of the related keying element,
   c. said switch means comprises two switching members, each connected to a related dial member so as to be rotatable therewith to various angularly spaced contact points for said circuit means, each contact point corresponding to a related mating location and angular orientation of a relating keying element,
   d. each of said circuit means comprising two sets of circuits, each circuit connected to and corresponding to a related contact point which in turn corresponds to the particular keying element for which the related dial element is positioned, so as to place the related switch member in engagement with the related corresponding circuit,
whereby when a particular unit is connected to the inter-facing member to be tested by the testing apparatus the two dial members are necessarily moved to position so that the two switch members are also rotated to positions to make contact with the two circuits corresponding to the unit being tested.

15. A method of testing a plurality of units where there is:
   a. test system hardware which is capable of providing testing inputs into a unit being tested and receiving test responses from the unit being tested,
   b. a computer having a plurality of test programs for various units to be tested, with said computer being programmed to selectively apply various test programs to various units being tested,
   c. each unit having a particular keying means, with the keying means of each unit having a predetermined mating orientation unique to the unit to which that keying means is mounted,
   d. a unit inter-facing member adapted and arranged to be connected to the test system hardware and selectively connected to said units, said inter-facing member comprising:
      1. a moveable mating means mounted to said inter-facing member in a manner to be moveable to a plurality of mating locations, each mating location corresponding to a related one of said keying means, such that at any one of said mating locations, the mating means is able to be matched to a corresponding keying means to engage that keying means in mating relationship and permit the unit inter-facing member to be connected to that unit having the keying means for which the mating means is matched,
      2. a plurality of circuit means, each of said circuit means corresponding to a related one of said units, and being arranged to generate an identifying signal for the unit to which the circuit means corresponds,
      3. a switch means operatively positioned between the plurality of circuit means and said testing apparatus, said switch means further being operatively connected to said mating means in a manner that with movement of said mating means to any particular mating location, said switch means connects to the testing apparatus circuit means which corresponds to the unit having keying means corresponding to that particular mating location,
said method being characterized in that it ensures that the proper test program is being applied to the particular unit being tested, said method comprising:
   a. connecting the unit which is being tested to the inter-facing member by first moving the mating means to the mating location corresponding to the unit being tested, and connecting the unit being tested to the inter-facing member with the keying means of that unit mating with the moveable mating means,
b. identifying the unit which is to be tested in the computer and creating an interrogating signal to be transmitted to said inter-facing member to activate said identifying circuit means and provide an identifying signal corresponding to the unit being tested,
c. comparing the identifying signal corresponding to the unit connected to the inter-facing member with a unit identification placed in the computer.

16. The method as recited in claim 15 wherein:
a. each of said keying means comprises at least one non-circular keying element having a particular angular orientation,
b. said method further comprising rotating the mating means to an angular mating location corresponding to that of the keying means of the unit to be tested.

17. The method as recited in claim 15, wherein:
a. said mating means comprises a rotatable dial member rotatably mounted to the interfacing member, and said switch means comprises a switch member connected to the dial member so as to be rotatable therewith to various angularly spaced contact points for said circuit means,
b. said method further comprising rotating said dial member to the mating location matching the keying means of the unit being tested, and thus bringing said switching member into contact at a corresponding contact point to connect a particular circuit means identifying the unit being tested into contact with said test system hardware.

* * * * *